(12) United States Patent
Ring et al.

(10) Patent No.: US 6,372,627 B1
(45) Date of Patent: Apr. 16, 2002

(54) METHOD AND ARRANGEMENT FOR CHARACTERIZATION OF FOCUSED-ION-BEAM INSULATOR DEPOSITION

(75) Inventors: Rosalinda M. Ring, Austin, TX (US); Susan Li, Fremont, CA (US); Glen Gilfeather, Del Valle, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/383,790

(22) Filed: Aug. 26, 1999

(51) Int. Cl.[7] .......................................... H01L 21/7463
(52) U.S. Cl. ........................ 438/622; 438/624; 438/18
(58) Field of Search ........................... 438/14, 48, 622, 438/624, 636, 637, 638, 640, 675, 676, 784

(56) References Cited

U.S. PATENT DOCUMENTS 6,069,366 A * 5/2000 Goruganhu et al. ... 250/559.27
6,171,944 B1 * 1/2001 Li et al. .................... 438/622

* cited by examiner

*Primary Examiner*—David Nelms
*Assistant Examiner*—Dung A Le

(57) ABSTRACT

According to one aspect of the disclosure and a particular example application directed to a flip-chip packaged die, a method for acquiring a signal from a target node in the circuit side includes removing substrate via the back side of the die to form an access area over the target node. A material is deposited in the access area over the target node in such a way to form simultaneously a conductive core and an immediately adjacent insulator. The conductive core is then used to couple a test signal between the target node and the conductive core. Other aspects of the disclosure include using a focused ion-beam system to provide varying concentrations of Gallium in forming simultaneously the conductive core and the immediately adjacent insulator. These aspects significantly lessen integrated circuit analysis and testing procedures.

35 Claims, 4 Drawing Sheets

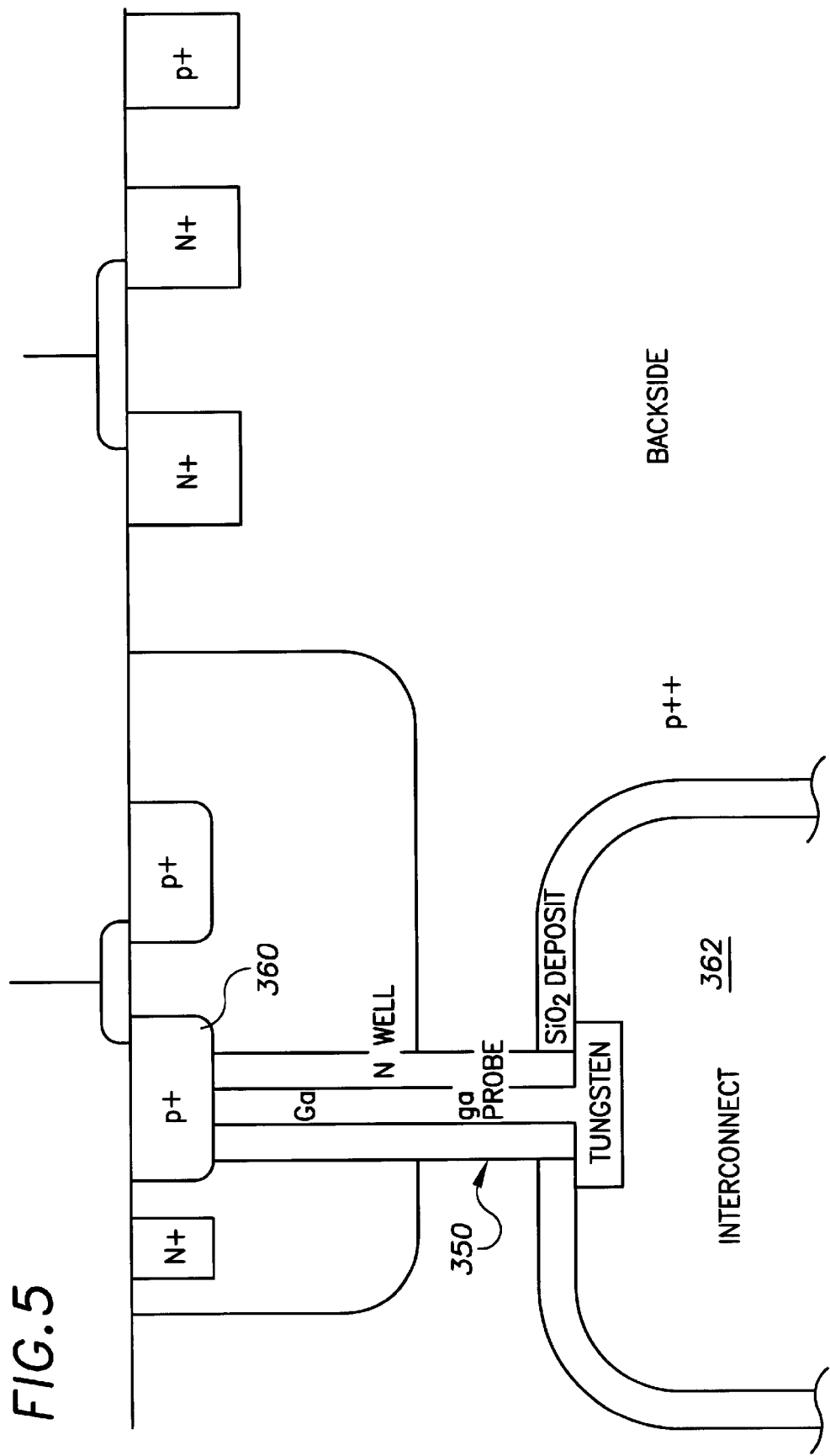

METHOD AND ARRANGEMENT FOR CHARACTERIZATION OF FOCUSED-ION-BEAM INSULATOR DEPOSITION

RELATED PATENT DOCUMENTS

The present application is related to co-pending U.S. Pat. No. 6,146,014 issued Nov. 14, 2000, Birdsley et al., entitled "Method for Laser Scanning Flip-Chip Integrated Circuits" (Docket No. AMDA.263PA); Ser. No. 09/074,627, Gilfeather et al., filed on May 7, 1998, entitled "Method and Article for Bringing Up Lower Level Metal Nodes of Multi-layered Integrated Circuits for Signal Acquisition" (Docket No. C920697); and Ser. No. 09/383,781, Rama R. Goruganthu et al., filed on Aug. 26, 1999, "Annealing Laser Induced Damage in Silicon for Aiding IR Imaging," (Docket No. AMDA.287PA/TT2889). These related patent documents are assigned to the assignee of the present invention, incorporated herein by reference, and priority to each of these applications is claimed for common subject manner thereto.

FIELD OF THE INVENTION

The invention relates to semiconductor device assemblies, and more particularly, to techniques for analyzing and debugging circuitry associated with multi-layer type and flip-chip type bonded integrated circuits.

BACKGROUND OF THE INVENTION

In recent years, the semiconductor industry has seen tremendous advances in technology that has permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for multiple layers of metal interconnects for routing signals to and from so many circuit devices, and increased numbers of external electrical connections to be present on the exterior of the die and on the exterior of the semiconductor packages, which receive the die, for connecting the packaged device to external systems such as a printed circuit board.

There have been a number of semiconductor dies and packaging types used to address these issues. Semiconductor devices that have multiple layers of metal signal-routing interconnects are often referred to as multi-layer devices. Multi-layer devices typically have two or more layers (or levels) of metal interconnects built up over the portion of the die having the active devices. At this "circuit" or "front" side of the die, where the transistors and other active circuitry are generally formed, is a very thin epitaxially-grown silicon layer on a single crystal silicon wafer from which the die is singulated. The circuit side of the die is positioned very near the package, and opposes the back side of the die. The substrate between the back side and the circuit side of the die is typically a bulk silicon, such as single crystalline silicon.

To increase the number of pad sites available for a die, especially for multilayer type dies, various semiconductor packaging types have been developed. One increasingly popular packaging technique is called "controlled collapse chip connection" or "flip-chip" packaging. In this technology, the bonding pads are provided with metal (solder) bumps. The bonding pads need not be on the periphery of the die and hence are moved to the site nearest the transistors and other circuit devices formed in the die. As a result, the electrical path to the pad is shorter. Electrical connection to the package is made when the die is flipped over the package with corresponding bonding pads and soldered. Once a flip-chip die is attached to the package, the back side portion of the die remains exposed. As a result, the dies are often referred to as "flip-chip" devices. Each bump connects to a corresponding package inner lead. The packages that result are lower profile, have lower electrical resistance, and a shortened electrical path.

The output terminals of such packages vary depending on the package type. For example, some output terminals are ball-shaped conductive bump contacts (usually solder, or other similar conductive material), and they are typically disposed in a rectangular array. These packages are occasionally referred to as "Ball Grid Array" (BGA). Another type of package, commonly known as a "Pin Grid Array" (PGA) package, implements the output terminals as pins.

The positioning of the circuit side of a die can be an important factor in the testing and analysis of the integrated circuit because oftentimes such testing and analysis involves device modification or re-routing of signals connected through the interconnects. For a multi-layer device, performing device modification or re-routing is not a simple task compared with, for example, a device having only one layer metal process. Many desired nodes are buried under other upper level metals, making it very difficult to access and even harder to connect from these nodes to other locations.

For a flip-chip device, which often includes multi-layer metals, performing device modification or re-routing is even more difficult. For example, one particular type of flip-chip package, known as the C4 type, increases the possible I/O numbers. For this kind of flip-chip with multi-layer metals, accessing the circuitry via the exposed back side of the die becomes necessary for probing and circuit repair because the circuit side of the flip-chip die is not visible or accessible for viewing using optical or scanning electron microscopy. Using the exposed back side of the die is challenging since the transistors are in a very thin layer (e.g., about 10 micrometers) of silicon buried under the bulk silicon (e.g., greater than 500 micrometers).

Although the circuit of the integrated circuit (IC) is buried under the bulk silicon (i.e., the single crystalline silicon), infrared (IR) microscopy is capable of imaging the circuit because silicon is relatively transparent in these wavelengths of the radiation. However, because of the adsorption losses of IR radiation in silicon, it is generally required to thin the die to less than about 100 microns in order to view the circuit using IR microscopy. To illustrate this difficulty, on a die that is 725 microns thick, at least 625 microns of silicon must be removed (or thinned) before IR microscopy can be used.

Thinning a flip-chip bonded die for failure analysis can be time consuming and burdensome. According to one common approach, thinning is accomplished in two or three steps. First, the die is thinned across the whole die surface and is referred to as "global thinning." Global thinning is done to allow viewing of the active circuit from the back side of the die using IR microscopy. Mechanical polishing is one method for global thinning. Once an area is identified as an area of interest and it is determined that access is needed to a particular area of the circuit, local thinning techniques can be used to thin an area smaller than the die size.

Focused ion-beam (FIB) milling is commonly used for thinning the back side of dice to permit e-beam signal acquisition to determine voltage levels of the nodes (e.g., to the millivolt level) while the part is actually operating. FIB milling is effective because it permits for local thinning to expose and/or access target circuitry nondestructively. For flip-chip multi-layer metal devices with advanced processes to expose the lower level metal nodes, the local thinning is implemented by milling deep, narrow holes through the back side of the die. For effective e-beam signal acquisition, the depth of the FIB hole should increase with its width. The ideal aspect ratio (depth to width) of a FIB hole is one to one. For a typical flip-chip having a relatively thick bulk silicon region between the back side and the circuit side of the die, the thickness of FIB holes must have an aspect ratio of about five to one. With this degree of aspect ratio, e-beam signal acquisition is very difficult.

This problem has been addressed by bringing up the lower level metal nodes via FIB milling and FIB deposition. For example, one such approach involves FIB milling to expose the desired lower metal nodes (and sometimes other metal nodes in the process), and FIB depositing insulator material to isolate the exposed nodes so that they do not short during subsequent metal deposition. Next, the FIB is used to re-mill through the deposited insulator material to expose just the desired lower metal nodes. This re-milling step is very difficult due to the poor contrast between underlying metal and the deposited insulator material. Finally, metal (Pt or W) is FIB deposited to back-fill the holes opened by the above re-milling step. This is a burdensome, time-consuming process that enjoys a very low success rate.

Accordingly, there is a need for improved systems and methods to test and analyze such integrated circuits.

SUMMARY OF THE INVENTION

According to one example embodiment, the back side of a semiconductor device, such as a flip-chip semiconductor device, is thinned to expose a selected region in the substrate. An access area is formed and then used to form a probe having a conductive core and a surrounding oxide region acting as an insulator for the conductive core. In a particular embodiment, the conductive core and the surrounding oxide region are made using varying concentrations of Gallium, for example, with the concentration of Gallium ions decreasing as distances furthest from the center of the core.

In a more particular embodiment, also for a flip-chip device that includes a package and a die having a circuit side, and having a substrate extending from a back side of the die, a method for acquiring a signal from a target node in the circuit side involves forming the core and insulator simultaneously. The method includes: removing at least some of the substrate via the back side and thereby forming an access area over the target node; depositing a material in the access area over the target node; using the deposited material to form simultaneously a conductive core and an immediately adjacent insulator; and coupling a signal between the target node and the conductive core.

In another example embodiment, the present invention is directed to a system for modifying a flip-chip type die to form a signal-coupler extending access to a target node in the circuit side. The system includes: a FIB milling apparatus configured and arranged to remove at least some of the substrate via the back side thereby forming an access area over the target node and to deposit a material in the access area over the target node, the deposited material simultaneously forming a conductive core and an immediately adjacent insulator.

In a more particular process of the present invention, the back side of a flip-chip die is milled down in a window (e.g., forming a 100-by-100 micron trench), oxide is deposited over the bottom surface in the window to protect the silicon in subsequent processing, and a gallium probe is formed over the node exposed by the trench using an ion-beam scan area that is smaller than the window.

In another embodiment of the present invention, a conductive probe such as the above-mentioned gallium probe is formed during die manufacturing, or after die manufacturing in connection with post-manufacturing failure analysis, for directly and/or indirectly coupling to targeted circuit regions. In various applications and circuit conditions, the conductive probe is used for acquiring signals from a targeted circuit region by coupling a signal sensor (e.g., voltmeter) to the probe point and for exciting a targeted circuit region by inputting a signal to the probe point and monitoring circuitry that reacts (or fails to react) to the excited target circuit region.

The above summary is not intended to describe each illustrated embodiment or every implementation of the present invention. The figures and the detailed description which follow more particularly exemplify these embodiments.

BRIEF DESCRIPTION OF THE DRAWINGS

The following detailed description can best be understood when read in conjunction with the following drawings, in which:

FIG. 5 shows a side view of a die, according to another example application and embodiment of the present invention.

Figure 1:
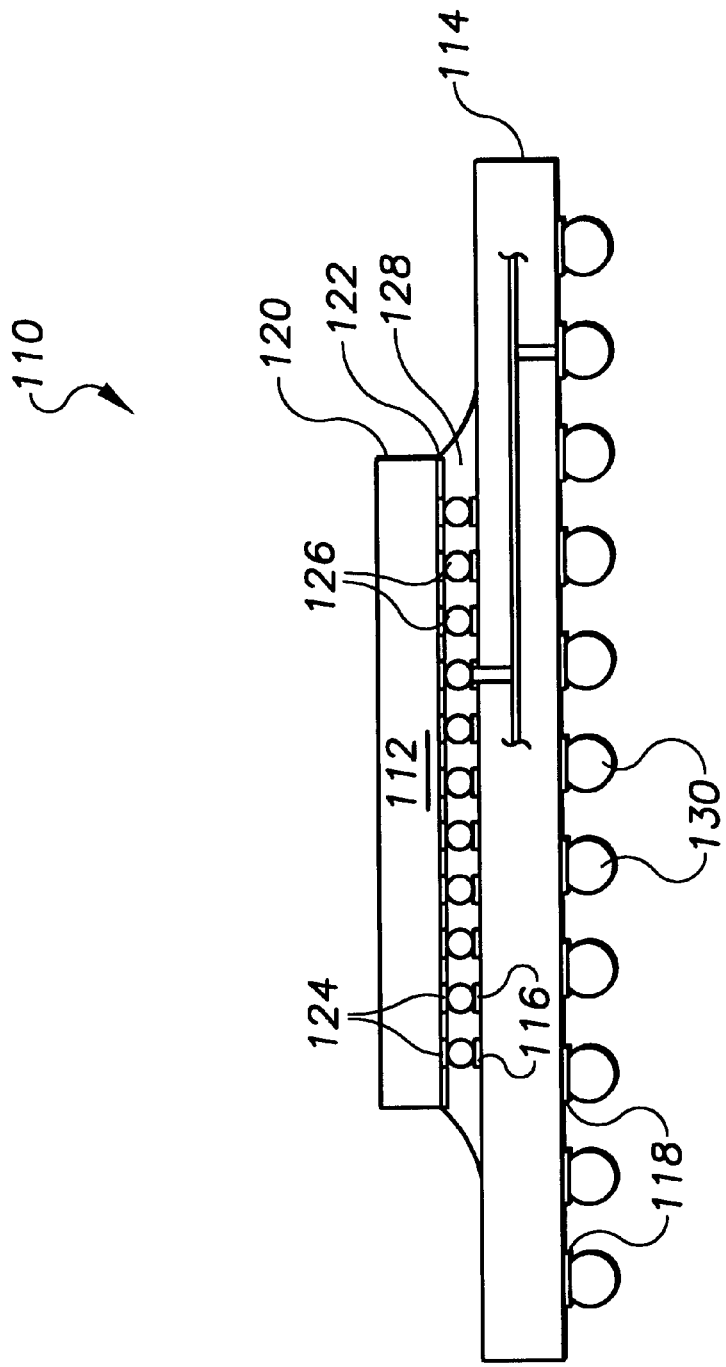
FIG. 1 shows a side view of a conventional integrated circuit packaged as a flip-chip device.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for failure analysis of flip-chip type circuit packages. While the present invention is not necessarily limited to flip-chip type circuit packages, an appreciation of various aspects of the invention is best gained through a discussion of examples in such an environment.

According to a particular example embodiment of the present invention, a conventional die, such as the die of a flip-chip type device or a normally-oriented packaged die, is tested after creating an access area, through the back side of a semiconductor device. The back side of a semiconductor device (also referred to as a die or integrated circuit) is first thinned to expose a selected target node, such as a metal interconnect. Material is then deposited in the access area over the target node, in a way that simultaneously forms a conductive core and an immediately adjacent insulator. Suspect circuitry may be then further analyzed by coupling a signal between the target node and the conductive core. For example, a test signal may be presented to the target node via the conductive core with the circuitry of the die being tested using conventional test equipment. Similarly, using conventional test equipment, the die and suspect circuitry therein may be further analyzed by coupling a signal from the target node through the conductive core and into the test equipment, or by coupling a signal to the target node via the conductive core so that other circuitry can react (or fail to react) as monitored by test equipment.

FIG. 1 shows a side view 110 of one type of conventional flip-chip type die 112 assembled to a package substrate 114. Flip-chip die 112 has a back side 120 and a circuit side in a portion of the die known as the epitaxial layer 122. The epitaxial layer 122 includes a number of circuit devices and has a thickness in the range of one to fifteen microns. Bulk silicon fills the back side 120 and is referred to as the bulk silicon layer. A plurality of solder bumps 126 are made on the circuit side at pads 124. The solder bumps 126 are the inputs and outputs to the circuitry associated with the flip-chip type die 112. The flip-chip type die 112 is attached to the package substrate 114 via the solder bumps on the die 112. The package substrate 114 includes pads 116 that are arranged to correspond to the pattern of solder bumps 126 on the die 112. The region between the die 112 and package substrate 114 is filled with an under-fill material 128 that encapsulates the solder bump connections and provides additional mechanical benefits. The pads 116 are coupled via circuitry to pads 118 on the package substrate, and solder bumps 130 are formed on the pads 118. The solder bumps 130 are the inputs and outputs to the circuitry associated with the package substrate 114.

For a flip-chip type die such as die 112 of FIG. 1, failure analysis is usually accomplished using a global and/or local thinning process. Example implementations for such thinning include: mechanically polishing; laser-microchemically etching; and local thinning via ion bombardment, for example, using a focused ion beam (FIB) system such as an FC-type FIB system available from Micrion, Inc. of Peabody, Mass. This type of system is particularly advantageous, because it can be used to complete various aspects of process embodiments according to the present invention. These aspects include, for example, etching, navigation and measurements via the system's built-in IR microscopy, and forming the type of probe discussed above.

After substrate from the back side of the die 112 is removed to provide an access area to a target node, such as a metal interconnect, a material (e.g., oxide-based) is deposited in the access area with the deposited material simultaneously forming a signal-coupling conductive core and an immediately-adjacent insulator, which can be used to fill the area between the core and the silicon substrate and acts as an insulator therebetween.

Figure 2B:
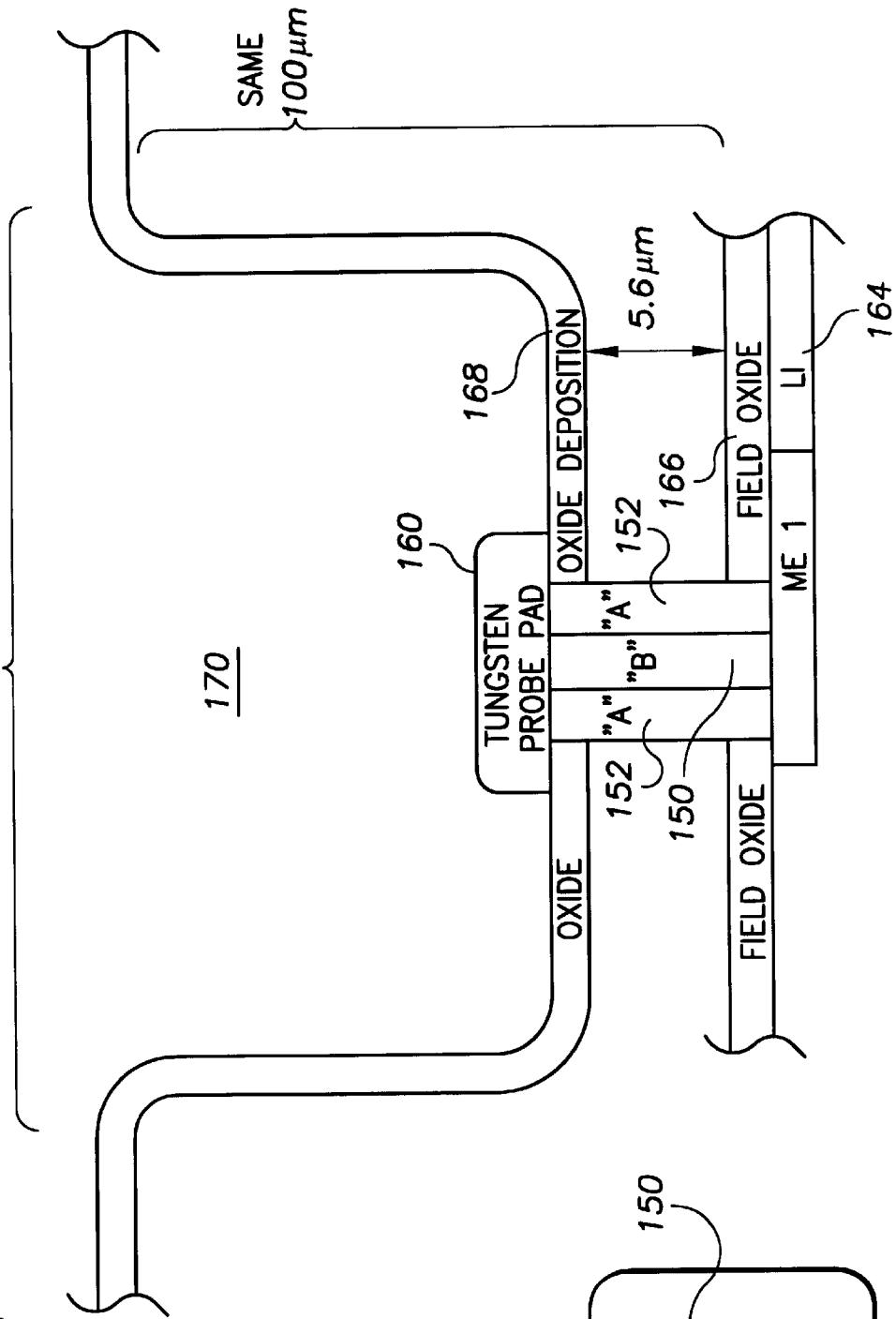
FIGS. 2A and 2B respectively illustrate cut-away and top-down views of a probe in the back side of a die, implemented according to an example embodiment and an example process of the present invention.
Figure 2A:
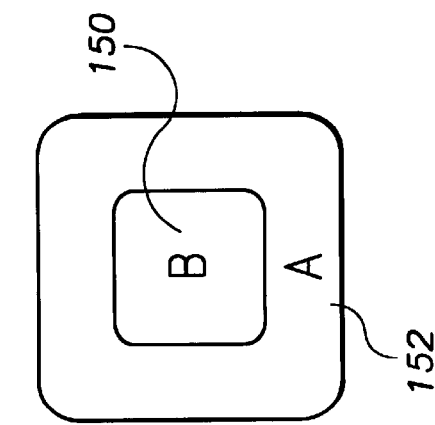

FIG. 2A illustrates an example signal-coupling oxide-based conductive core 150, and a surrounding insulator 152, which uses Gallium as an example conducting, material. The core of the oxide probe is due to the concentration of Gallium ions at the center of the oxide probe. The surrounding substance is nonconductive oxide that, due to fallout from the concentrated center (e.g., the scan area), includes a lower concentration of Gallium ions. The conductive core is then used for analysis; for example, suspect circuitry may be further analyzed by coupling a signal to or from the target node with the conductive core being used to direct a signal generated from test equipment or to receive a signal on the target node and couple it to test equipment.

In a particular implementation, a target circuit in a flip-chip packaged integrated circuit is analyzed by acquiring wave forms from a node in the circuit using the following example procedure involving a FIB system. After removing the lid of the flip-chip packaged integrated circuit and exposing the back side of the die, the substrate is thinned down, for example, to about 80–100 microns, above the underlying circuitry. This is accomplished, for example, using chemical-mechanical polishing (CMP). The uniformity of the polisher may limit the extent to which the die can be thinned without switching to a more precise tool. Conventional IR microscopy and CAD tools are used for imaging and navigation as the die is being thinned. The mechanically thinned silicon die is then locally thinned over the target node region until there is only about 15 microns of remaining silicon. In one implementation, the localized thinning is rectangular in shape and can be performed using a laser chemical etcher (LSE), and/or a focused ion beam (FIB) tool such as the FC-type mentioned above.

The area under the trench is then further thinned in a FIB system to about 3 microns of remaining silicon, for example, using a laser beam for local thinning. Planarity of the trench bottom after laser etching can be important in this regard, and an effective LSE technique can be used to provide such planarity. The silicon removal rate is greater for mechanical polishing than for the laser process, which has a higher removal rate than FIB etching. A combination of these processes can be advantageously used to enhance the throughput of the overall design debug modification-process.

Next, a thin layer of oxide (e.g., 168 of FIG. 2B) is deposited in the bottom of the trench using the FIB in the presence of a precursor gas. This oxide protects the silicon from any future gas assisted work using the FIB, and also prevents the metal deposits from shorting to the substrate.

After the oxide layer is formed, one or more target nodes are exposed. Using a CAD tool, each node that will be contacted or cut is located and then exposed using the FIB in the presence of $XeF_2$ gas. For further information regarding use of the FIB system in this manner, reference may be made to J. D. Casey, Jr., A. F. Doyle, R. G. Lee, and D. K. Stewart, "Gas-Assisted Etching With Focused Ion Beam Technology," *Microtechnology Eng.*, Vol. 24, p.43, 1994. The nodes that will be contacted for re-wire or used as probe points are covered with FIB-deposited dielectric and then re-exposed through the dielectric. This aspect of the approach is helpful to avoid shorting the nodes to the bulk silicon when contact is made to these nodes.

Finally, the target nodes or metal lines are exposed for use as probe points, cut and connected to metal lines as is commonly done in traditional FIB design/debug applications.

To ensure the integrity of the part, controlled silicon thinning is desired for local thinning of the die in these applications. Optical beam induced current (OBIC) can be used as a method to measure the thickness of silicon overlaying the active circuit regions of interest. OBIC is used, for example, as an endpoint signal for silicon removal on both the LCE and the FIB tool as described in connection with U.S. patent application Ser. No. 09/050,531, entitled "Endpoint Detection For Thinning of Silicon of a Flip Chip Bonded Integrated Circuit," filed on Mar. 30, 1998, by Rama Gorugantha, et al., and "Controlled silicon thinning for design debug of C4 packaged ICs." Proc. $37_{th}$ Annual Intemat. Rel. Phys. Symp., Mar. 22–25, 1999, both of which are incorporated herein by reference. Further information addressing aspects of trench planarity, surface roughness, and metal line deposition processes using these tools to accomplish circuit edits are also described in connection with these above-mentioned documents.

When laser chemical etching, a focused argon ion laser beam of power sufficient to cause localized surface melting can be scanned over the silicon surface in a chlorine-ambient chemistry at 100–400 Torr. The melt zone of silicon reacts with chlorine to form volatile silicon chloride and forms the basis for laser chemical etching of silicon. For further information concerning such laser chemical etching, reference may be made to J. J. Ritsko, *Laser Microfabrication: thin film processes and lithography*, Ed. by D. J. Ehrlich and J. Y. Tsao. p. 333 San Diego, Academic Press, 1989, incorporated herein by reference.

To enhance imaging through the silicon, a laser-chemical etching apparatus can be used at greater and lesser energy levels to smooth the newly formed surface at the thinned region. Such a technique is described and illustrated in connection with the above-referenced U.S. Patent Application entitled "Annealing Laser Induced Damage in Silicon for Aiding IR Imaging," by Rama R. Goruganthu et al.

At this stage, the FIB system is used to deposit material in the trench in a way that simultaneously forms a conductive core and an immediately adjacent insulator. By scanning the ion beam about the center of the target area using the process developed in connection herewith, the system simultaneously forms both the signal-coupling conductive core and the adjacent insulator. In one example implementation in connection with the present invention, it has been discovered that an FIB system can be used to deposit a conductive probe, such as a Gallium probe, including a conductive center in the ion beam scan area (e.g., 0.5 -by-0.5 micron access area) and an insulative sheath outside the ion beam scan area within the access area (or hole). This is done by setting the pixel spacing of the beams so that there is less overlap, thereby avoiding the FIB system from milling and by balancing the beam dwell, retrace and refresh times. This balance is between the time the ion beam spends at each pixel and the time the beam is intentionally kept away from the surface to allow gas adsorption for chemical reaction. Dwell time refers to the amount of time the focused ion beam spends at each pixel when the beam is on. Adequately insulative in this context refers to signals carried by the conductive core not being shorted to adjacent semiconductor regions (e.g., doped, metal or otherwise); in one application, for example, the resistivity of the sheath is at least 1 megaohm per square.

According to another specific embodiment, a FIB-induced deposition process involving micro-chemical vapor deposition includes the adsorption of precursor reactive gases on the substrate as a molecular layer, and the interaction of the ion beam with the gas present in the target area. The energy of the ion beam induces decomposition of the gas causing deposition. $SiO_2$ deposition is generated using TMCTS (1,3,5,7 tetramethyl cyclo tetrasiloxane) and oxygen as precursor gasses. The process relies on adsorption of the molecular monolayer to the target surfaces and uniform gas flux density over the area of interest. Raster parameters are varied to provide sufficient energy to initiate a chemical reaction. As the beam is rastered, sputtering occurs with resultant heat energy liberated. This energy causes either disassociation (sputtering) or deposition. When the beam is on, the gas goes to the access area outside the beam scan area, and the energy at the fringes of the beam scan area provides enough energy to initiate the reaction with the precursor gases causing non-conductive insulator deposition.

When the beam is blanked (off) during retrace and refresh times, the beam is intentionally kept away from the surface to allow gas precursor adsorption to the surface for chemical reaction.

When the beam is blanked (off), the gases go to the access area outside and inside the beam scan area and are adsorbed onto the surface. This adsorption can involve adjusting the retrace and refresh times sufficiently to allow formation of a monolayer of gas molecules on the surface. For adjustment purposes, longer retrace and refresh times correspond to increased gas being adsorbed up to the limit when all the surfaces are consumed (or occupied).

When the beam is on again, TMCTS and oxygen are being mixed on the area outside the beam area, and the gases on beam scan area interact with the beam-generated heat (along the fringes of the beam scan area) to form a $SiO_2$ deposition. The reaction is: $C_4H_{16}O_4Si_4 + O_2 \rightarrow SiO_2 + CO_2 + C$ (containing ions/molecules); where $C_4H_{16}O_4Si_4$ is TMCTS.

Additional oxygen provides stoichiometric concentration, for example, in a ratio of 1Si to 2 O. The oxygen in the reaction chamber is used to form $SiO_2$ which is a preferred path for the reaction, thus increasing in deposition yield and reducing carbon in the deposit (i.e., less resistive deposit).

The gases in the beam scan area interact with the ion beam to form a monolayer of $SiO_2$ deposition. Since the dwell time is long, the beam scan area becomes gas depleted, (i.e., there are not enough gases on the surface for the reaction, but there is still implanting of gallium ions on the surface). When complete depletion occurs, sputtering or milling becomes favorable.

Accordingly, for this example embodiment, to generate such a "gallium probe" in the ion beam scan area with an adequate insulator outside the beam scan area, the raster and/or beam scan parameters are optimized within the window for gallium implantation by: setting the pixel spacing high to reduce beam overlap to promote deposition; balancing the dwell, retrace, and refresh times such that the effective beam current density at each pixel is sufficient and the precursor gases concentration adsorb on the surface are enough for deposition.

Long refresh and retrace times are favorable for the reaction because during these times that the beam is blanked away from the scan area but tailed towards the edge outside the beam scan area. The energy from the beam tail fuels the decomposition of the adsorbed gases on the area outside the beam scan area with deposition occurring around the beam scan area.

Adequately insulative in this context means that, for purposes of testing the circuit connecting to the target node, signals carried by the conductive core will not be shorted to adjacent semiconductor regions (e.g., doped, metal or otherwise). This insulator is typically silicon substrate from the back side and other metal layers from the front side. In one application, for example, the resistivity of the sheath is at least 1 megaohm per square.

The following specific example implementation is directed to a 1 micron by 1 micron rectangular box-like trench, with an FC-type FIB system (e.g., a 5 nm high resolution 50 keV FIB column) used to deposit a Gallium probe using an aperture size of 150 microns and a beam blanking aperture current of 672 picoAmperes: pixel spacing of the beams at 0.25 microns; dwell time at 18 microseconds; retrace and refresh times at 240 and 3000 microseconds, respectively; E dwell time at 10 microseconds; gas pressures for TMCTS at 1 torr and for $O_2$ at 0.05 torr; and a beam current density of about 42 Å/cm$^2$.

It will be appreciated that the above set of parameters are merely examples for the given example application. For other FIB-systems and trenching applications, the parameters would likely change.

This process allows the FIB system to not only aid in defining the trench, but also to deposit a highly conductive gallium-rich oxide that forms the signal-coupling conductive core and the adjacent insulator. This process is significant in that it alleviates a significant amount of time otherwise required to separately form first the oxide over the exposed area to isolate the circuitry from the target node or metal, and then, using a subsequent process, milling/sputtering through this oxide before depositing a metal via and probe pad, as is conventional.

FIG. 2B illustrates a cross-sectional view (170) of the flip chip die 112 of FIG. 1, modified to include the probe of FIG. 2A implanted beneath a tungsten probe pad 160. The tungsten probe pad 160 is directly connected with a metal line 164, which is insulated by a field oxide layer 160, formed during the manufacture of the die.

As in the example embodiments discussed above, this example structure includes a depth of typically 3–4 microns between the metal line 164, or the field oxide 166, and the tungsten probe pad 160. (The oxide layer 168 is deposited after the trench is etched and before the more focused trench is made for the gallium probe.)

Figure 3:
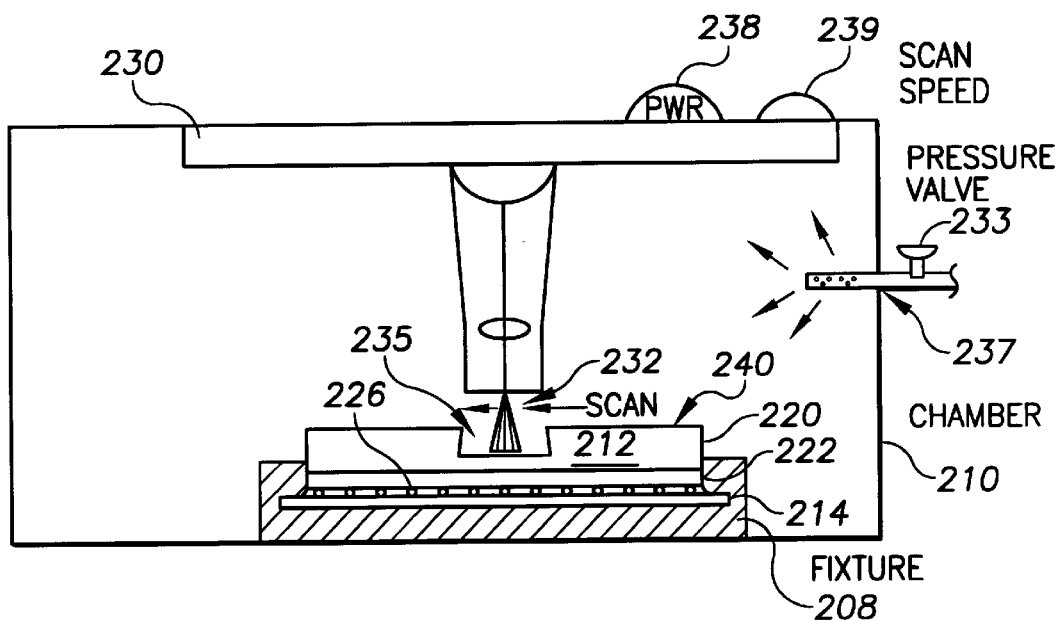
FIG. 3 shows a side view of an example arrangement for thinning the integrated circuit of FIG. 1 and for providing an access area via a back side of the flip-chip die, according to the present invention.
Figure 4:
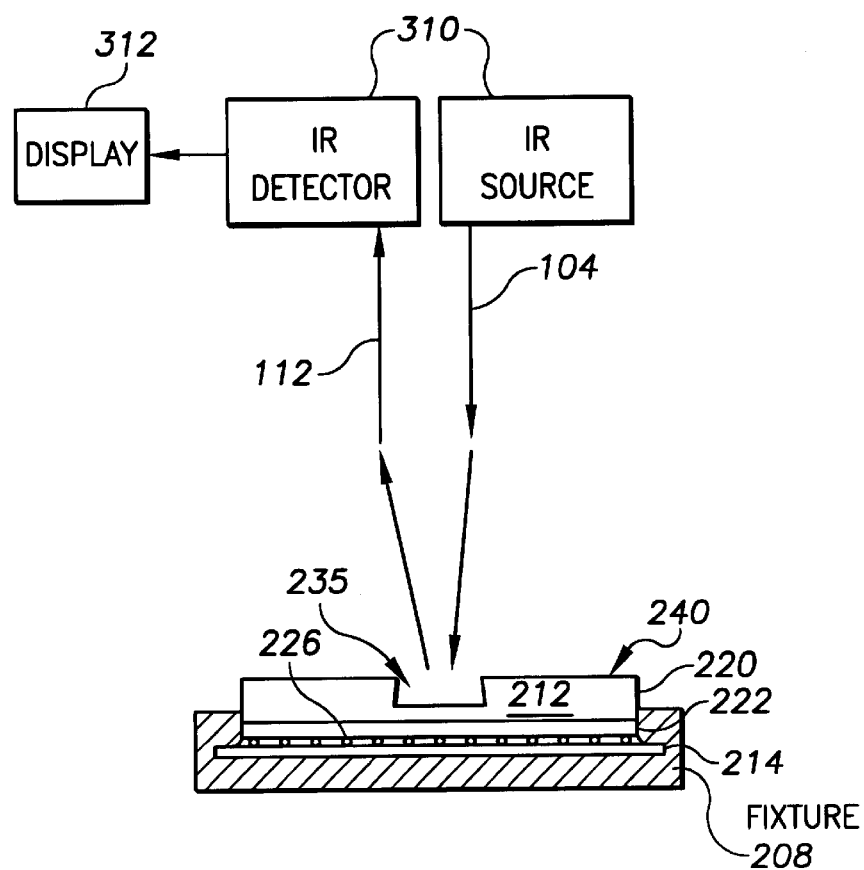
FIG. 4 shows a side view of an example arrangement for capturing images using an access area formed in the back side of a disc, also according to the present invention.

FIGS. 3 and 4 show a schematic view of an example thinning/test system in which a substrate 220 of a flip-chip type die 212, as attached to a package substrate 214, is secured in and connect to (via terminals 226) a fixture 208 within a chamber 210. The system includes an apparatus 230 such as a laser-chemical etching apparatus or a FIB system for thinning the die 212 by removing portions of the back side 220 of the die 212. The apparatus 230 produces a laser beam 232 which, in the presence of a gas that is reactive with the substrate, can be used to locally or globally thin the die, such as to remove silicon across a selected portion or the entire back side of surface 240.

In the example system of FIG. 3, the reactive gas is provided by way of gas-input port 237 to the chamber 210. A trench 235 in this illustrated example application is provided by locally-thinning a portion of the die 212. In another application, the back side 220 is globally thinned to remove the surface 240 entirely.

To facilitate effective acquisition of e-beam signals off the target node, the trench or box for accessing the target node is advantageously sized to assure the lowest possible aspect ratio (i.e., depth versus width) without penetrating to the adjacent active regions. As mentioned previously, for e-beam probing, an aspect ration of one to one is ideal.

The apparatus 230 of FIG. 3 includes adjustment controls 238 and 239 for respectively adjusting the power and scan speed of the etching apparatus 230. Gas-input port(s) 237 to the chamber 210 includes a valve 233 for adjusting the chamber pressure.

FIG. 4 illustrates the die 212, after the thinned region has been smoothed as described above and with an unimpeded path through the back side of the semiconductor device for IR microscopy (via source beam 104 and response beam 112). An IR microscopy apparatus including an infrared transmitter/receiver 310 and a monitor 312, is used to capture an image of a circuit in the circuit side of the die 212 through its back side 220. An example IR microscopy apparatus that can be used in this application is a confocal laser scanning microscopy, manufactured and sold by Zeiss, Inc. To minimize process steps, the FC-type FIB system, which incorporates a built-in IR microscopy arrangement, is preferred.

FIG. 5 illustrates another application according to the present invention, in which the above-characterized Ga probe 350 is used to form a connection between an active region, in this instance p+drain/source region 360, and an interconnect 362. For back side failure analysis, this probe application can be implemented by first ion-beam milling (e.g., using the same FIB machine) a via into which the Ga probe 350 is formed. The via ends upon detection of the p+region 360, and the probe 350 is then used to electronically connect the p+region 360 with the interconnect 362.

Images and signals at the target node(s) are obtained to further evaluate the circuit side of the die using, for example, a conventional test fixture such as described in connection with U.S. Patent Application entitled "Endpoint Detection For Thinning A Flip Chip Bonded Integrated Circuit," by Jeff Birdsley, Ser. No. 09/247,002, filed Feb. 8, 1999, and herein incorporated by reference in its entirety.

The present invention is amenable to various modifications and alternative forms that depart from the particular embodiments described above. The invention is to cover modifications, equivalents, and alternatives falling within the spirit and scope of the invention as defined by the appended claims.

What is claimed is:

1. For a flip-chip device that includes a package and a die having a circuit side and having a substrate extending from a back side of the die, a method for acquiring a signal from a target node in the circuit side, comprising:
   removing at least some of the substrate via the back side and thereby forming an access area over the target node;
   depositing a material in the access area over the target node, and using the deposited material to form simultaneously a conductive core and an immediately adjacent insulator; and
   coupling a signal between the target node and the conductive core.

2. A method for acquiring a signal from a target node in the circuit side, according to claim 1, wherein depositing a material in the access area over the target node further includes using a first concentration of ions to form the conductive core and using another concentration of ions to form the insulator.

3. A method for acquiring a signal from a target node in the circuit side, according to claim 2, wherein the ions of the first and second concentrations are of the same type.

4. A method for acquiring a signal from a target node in the circuit side, according to claim 2, wherein the ions of the first and second concentrations include Gallium.

5. A method for acquiring a signal from a target node in the circuit side, according to claim 1, wherein depositing a material in the access area over the target node includes scanning an ion-beam using a first concentration of ions to form the conductive core and using a reduced concentration of ions to form the insulator.

6. A method for acquiring a signal from a target node in the circuit side, according to claim 5, wherein the ions of each of the concentrations include Gallium.

7. A method for acquiring a signal from a target node in the circuit side, according to claim 6, further including using a single ion-beam tool for the steps of removing and depositing.

8. A method for acquiring a signal from a target node in the circuit side, according to claim 1, further including using a single ion-beam tool for the steps of removing and depositing.

9. A method for acquiring a signal from a target node in the circuit side, according to claim 1, wherein coupling a signal between the target node and the conductive core includes directing the signal from the target node to the conductive core.

10. A method for acquiring a signal from a target node in the circuit side, according to claim 1, wherein coupling a signal between the target node and the conductive core includes directing the signal to the target node from the conductive core.

11. A method for acquiring a signal from a target node in the circuit side, according to claim 1, wherein depositing a material and using the deposited material includes forming the conductive core electrically connected to an interconnect.

12. A method for acquiring a signal from a target node in the circuit side, according to claim 1, wherein depositing a material in the access area includes applying pixel beams that are spaced not to overlap, and setting dwell, refresh and retrace times sufficiently long to concentrate ions at the center of the access area.

13. A method for acquiring a signal from a target node in the circuit side, according to claim 12, wherein depositing a material in the access area further includes reacting a Gallium ion beam with a gas substance having a chemistry that causes non-conductive insulator deposition around a Gallium core.

14. A method for acquiring a signal from a target node in the circuit side, according to claim 13, wherein reacting a Gallium ion beam with a gas, further includes combining $O_2$ with TMCTS to counter an inclusion of carbon in the deposition.

15. A method, according to claim 14, wherein the conductive core includes a first concentration of Gallium.

16. A method, according to claim 15, wherein the insulator includes a second lesser concentration of Gallium.

17. For a flip-chip device that includes a package and a die having a circuit side and having a substrate extending from a back side of the die, a system for acquiring a signal from a target node in the circuit side, comprising:
   means for removing at least some of the substrate via the back side and thereby forming an access area over the target node;
   means for depositing a material in the access area over the target node, and using the deposited material to form simultaneously a conductive core and an immediately adjacent insulator; and
   means for coupling a signal between the target node and the conductive core.

18. The system of claim 17 wherein the means for removing and the means for depositing is a single ion-beam source having means for delivering a concentration of ions for the conductive core and for the immediately adjacent insulator.

19. For a flip-chip device that includes a package and a die having a circuit side and having a substrate extending from a back side of the die, a system for modifying the die to form a signal-coupler extending access to a target node in the circuit side, comprising:
   a FIB milling apparatus configured and arranged to remove at least some of the substrate via the back side and thereby forming an access area over the target node and to deposit a material in the access area over the target node, the deposited material simultaneously forming a conductive core and an immediately adjacent insulator.

20. A system for modifying, according to claim 19, wherein the FIB milling apparatus is further configured and arranged to provide a first concentration of ions to form the conductive core and provide another concentration of ions to form the insulator.

21. A system for modifying, according to claim 20, wherein the ions of the first and second concentrations are of the same type.

22. A system for modifying, according to claim 19, wherein the ions include Gallium.

23. A system for modifying, according to claim 19, wherein the FIB milling apparatus is further configured and arranged to scan an ion-beam using a first concentration of ions to form the conductive core and using a reduced concentration of ions to form the insulator.

24. A system for modifying, according to claim 23, wherein the ions of each of the concentrations include Gallium.

25. A system for modifying, according to claim 19, further including a signal generator and a signal monitor, the signal generator being configured and arranged to direct a signal to the conductive core, and the signal monitor being configured and arranged to detect a signal at the target node via the conductive core.

26. A system for modifying, according to claim 19, further including a signal monitor configured and arranged to detect a signal at the target node via the conductive core.

27. A system for modifying, according to claim 26, further including an integrated circuit tester configured and arranged to provide power and test signals to the die, wherein the signal monitor is further configured and arranged to respond to the test signals by detecting a signal at the target node via the conductive core.

28. A system for modifying, according to claim 19, wherein the FIB milling apparatus is further configured and arranged to deposit the material in the access area to form the conductive core electrically connected to the target node.

29. A system for modifying, according to claim 19, wherein the FIB milling apparatus is further configured and arranged to deposit the material by applying pixel beams that are spaced not to overlap, and setting dwell, refresh and retrace times sufficiently long to concentrate ions at the center of the access area.

30. A system for modifying, according to claim 29, wherein the FIB milling apparatus is further configured and arranged to deposit the material by reacting a Gallium ion beam with a gas having a chemistry that creates a non-conductive insulator deposition around a Gallium core.

31. A system for modifying, according to claim 29, wherein the FIB milling apparatus is further configured and arranged to combine $O_2$ with TMCTS to counter a carbon byproduct that is generated as a result of the reaction.

32. A semiconductor device modified using the system of claim 19.

33. A semiconductor device, according to claim 32, wherein the conductive core includes a first concentration of Gallium.

34. A semiconductor device, according to claim 33, wherein the insulator includes a second, lesser concentration of Gallium.

35. A semiconductor device, comprising: a semiconductor die having a back side including bulk silicon, and a probe having a conductive core and a surrounding oxide region acting as an insulator for the conductive core, wherein each of the conductive core and the surrounding oxide region include different concentrations of Gallium and with the concentration of Gallium ions decreasing at distances furthest from the center of the core.

* * * * *

UNITED STATES PATENT AND TRADEMARK OFFICE
CERTIFICATE OF CORRECTION

PATENT NO. : 6,372,627 B1
DATED : April 16, 2002
INVENTOR(S) : Ring et al.

It is certified that error appears in the above-identified patent and that said Letters Patent is hereby corrected as shown below:

Column 1,
Line 8, "6,146,014issued" should read -- 6,146,014 issued --.
Line 32, "has" should read -- have --.

Column 3,
Line 44, "as" should read -- at --.

Column 7,
Line 2, "LCE" should read -- LSE --.

Column 10,
Line 15, "p+drain" should read -- p+ drain --.
Line 20, "p+region" should read -- p+ region --.
Line 21, "p+region" should read -- p+ region --.

Signed and Sealed this

Twenty-fifth Day of June, 2002

Attest:

JAMES E. ROGAN
Attesting Officer   Director of the United States Patent and Trademark Office